US010030158B2

(12) United States Patent
Dixon et al.

(10) Patent No.: US 10,030,158 B2
(45) Date of Patent: Jul. 24, 2018

(54) INK

(71) Applicant: Intrinsiq Materials Ltd, Farnborough Hampshire (GB)

(72) Inventors: Richard Dixon, Hampshire (GB); Jose Pedrosa, Hampshire (GB); Kai Man Kerry Yu, Hampshire (GB); Chih-Hao Yu, Hampshire (GB)

(73) Assignee: Intrinsiq Materials Ltd., Farnborough, Hampshire (GB)

( * ) Notice: Subject to any disclaimer, the term of this patent is extended or adjusted under 35 U.S.C. 154(b) by 351 days.

(21) Appl. No.: 14/441,025

(22) PCT Filed: Nov. 6, 2013

(86) PCT No.: PCT/IB2013/059950
§ 371 (c)(1),
(2) Date: May 6, 2015

(87) PCT Pub. No.: WO2014/072918
PCT Pub. Date: May 15, 2014

(65) Prior Publication Data
US 2015/0274994 A1    Oct. 1, 2015

(30) Foreign Application Priority Data

Nov. 6, 2012  (GB) .................................. 1219961.8

(51) Int. Cl.
*C09D 11/00*    (2014.01)
*C09D 11/322*   (2014.01)
(Continued)

(52) U.S. Cl.
CPC ............ *C09D 11/00* (2013.01); *B22F 1/0022* (2013.01); *B22F 7/08* (2013.01); *B22F 9/04* (2013.01);
(Continued)

(58) Field of Classification Search
CPC ....... C09D 11/00; C09D 11/322; C09D 11/52; C09D 5/006; C08K 3/34; B22F 1/0022;
(Continued)

(56) References Cited

U.S. PATENT DOCUMENTS 2,924,004 A    2/1960  Wehrmann et al.
5,470,506 A   11/1995  Tanigami et al.
(Continued)

FOREIGN PATENT DOCUMENTS

EP    1 028 476 A1    8/2000
EP    2 374 839 A1   10/2011
(Continued)

OTHER PUBLICATIONS

English translation of WO 2012/095311, Jul. 2012; 13 pages.*
(Continued)

*Primary Examiner* — Helene Klemanski
(74) *Attorney, Agent, or Firm* — Dority & Manning, P.A.

(57) ABSTRACT

The invention relates to an ink composition suitable for applications onto solar cells. Specifically, the invention describes several compositions, using nickel/silicon alloys which have been found to be particularly effective contact metallization of emitter layers. The ratio of nickel to silicon in claimed invention is in the range of 0.1:1 to 1:0.1.

8 Claims, 5 Drawing Sheets

(51) Int. Cl.
*C09D 11/52* (2014.01)
*C09D 5/00* (2006.01)
*C08K 3/34* (2006.01)
*B22F 1/00* (2006.01)
*B22F 7/08* (2006.01)
*B22F 9/04* (2006.01)
*H01L 31/0224* (2006.01)

(52) U.S. Cl.
CPC ............... *C08K 3/34* (2013.01); *C09D 5/006* (2013.01); *C09D 11/322* (2013.01); *C09D 11/52* (2013.01); *H01L 31/022425* (2013.01); *B22F 2202/13* (2013.01); *Y02E 10/50* (2013.01)

(58) Field of Classification Search
CPC .......... B22F 7/08; B22F 9/04; B22F 2202/13; H01L 31/022425; Y02E 10/50
USPC ............................................... 106/31.9, 31.92
See application file for complete search history.

(56) References Cited

U.S. PATENT DOCUMENTS

| 2004/0005468 | A1 | 1/2004 | Steinecker | |
|---|---|---|---|---|
| 2010/0006145 | A1 | 1/2010 | Lee | |
| 2010/0163101 | A1* | 7/2010 | Kumar | H01L 31/022425 252/514 |
| 2010/0285656 | A1* | 11/2010 | Esconjauregui | B01J 23/74 438/478 |
| 2011/0250096 | A1* | 10/2011 | Ido | F01N 3/0222 422/177 |
| 2015/0056383 | A1* | 2/2015 | Pedrosa | H05K 1/097 427/556 |
| 2015/0122323 | A1* | 5/2015 | Khatri | H01L 31/022425 136/256 |

FOREIGN PATENT DOCUMENTS

| JP | 5305981 A | 5/1978 |
|---|---|---|
| JP | 53060171 A | 5/1978 |
| JP | S5359891 | 5/1978 |
| JP | S5460171 | 5/1978 |
| WO | WO 89/12321 A1 | 12/1989 |
| WO | WO 2006/133949 A2 | 12/2006 |
| WO | 2012-073021 A1 | 7/2010 |
| WO | 2012/095311 A1 | 7/2012 |

OTHER PUBLICATIONS

English translation of JP 53/060171, May 1978; 3 pages.*
Dowanol DB Product Information, The Dow Chemical Company, Apr. 1997; 2 pages.*
International Search Report, dated Feb. 22, 2013.
International Search Report, dated Mar. 28, 2014.

* cited by examiner

INK

FIELD

The invention relates to an ink formulation comprising fine particles, in particular to an ink formulation comprising nickel and/or silicon fine particles generally for incorporation into solar cells.

BACKGROUND

Fine particles (including nanoparticles) have a wide range of uses, with increasing world population and decreasing fossil fuel resources, renewable energy is becoming ever more in demand, and so the utility of fine particles in renewable energy applications is being considered.

One application where fine particles may be of particular use is as a component of silicon-based solar cells, such cells are the focus of much interest as a means of providing renewable energy. The basic structure of silicon solar cells includes an emitter (a positive doped area) and a base (a negative doped area) and is well known in the art. A photo effect generates charge carriers which are separated by a p-n junction, and as they cannot cross the junction, the charge carriers are conducted externally via metal contacts on both sides.

The emitter doping in standard solar cells is always a compromise as these cells have homogenous emitters. A high n-doping (for instance phosphorous) is used in the emitter layer to minimize the resistivity between semiconductor and metal contacts. However, recombination losses increase with rising n-dopant concentration, and this has an adverse impact on power generation.

One method of increasing solar cell efficiency is to use selective emitter solar cells. Here, the n-dopant concentration is selectively controlled so that only the area nearest to the contact is highly doped, and therefore has a low emitter resistivity. The remainder of the surface has a lower phosphorous doping concentration, so that as large a part of the cell as possible can be used for electricity generation—the lower dopant concentration reducing recombination losses and improving the cell's blue response. This combines an improved solar cell performance with very good ohmic contact.

The metal contact layer can use a silver paste to form the electrode system, but the cost is an issue to acceptance of this. Further the silver is often a porous paste having high contact resistance to the underlying silicon, and the adhesion to the silicon layer can be relatively poor (US2011/0318872 and Global Solar Technology, No. 3.8, page 6-10). The contact layer is usually formed using a screen printing process, but this has limitations on producing thin electrode tracks, thus causing shadowing effects that effectively prevent sunlight from reaching parts of the cell, thus reducing the efficiency.

The feasibility of replacing the silver with a low cost material has been investigated. For instance, copper has been used as a cheaper alternative to silver; however, when deposited directly onto the silicon substrate there are problems with diffusion of the copper into the silicon, which impairs the electronic properties of the cell.

Nickel has also attracted interest. A nickel seed layer can be deposited directly onto the silicon substrate to form a low resistivity nickel silicide ohmic contact. This layer can then be thickened with silver or copper plating to improve conductivity. The nickel silicide layer acts as a barrier layer between the silicon and copper preventing diffusion of the copper into the silicon. The nickel can be deposited by standard electroless plating methods (for example, as described in "Formation of a low ohmic contact nickel silicide layer on textured silicon wafers using electroless nickel plating", A. Nguyen, et al.).

However, this deposition of the nickel layer directly onto the silicon causes consumption of the silicon substrate, which is often undesirable. Since the underlying substrate is consumed, any doping of the silicon layer, e.g., with phosphorous, will be effected. Further since silicon is the largest cost in conventional solar cell manufacture, if it is not consumed in the formation of the contacts, the amount needed is reduced, providing for significant cost savings. Thus not consuming the silicon substrate is advantageous.

There is therefore a need to improve the contact metallization of the emitter layer. The standard process basically involves three steps—i) opening contacts holes through an anti-reflective layer, ii) forming electrical contact to the silicon with good adhesion, and iii) creating a conducting path away from the contact.

The anti-reflective layer generally covers the entire cell apart from the electrical contact areas. These contact areas form a 'shadow' pattern on the front side of the cell and so are desirably as fine and shallow as possible. For the greatest efficiency of the cell the smaller the contact area the better. Traditional screen printing techniques are such that the shadow pattern effects the efficiency of the cell, and it would be useful to reduce the size of the contacts, hence improving the overall efficiency of the cell. The invention is intended to overcome or ameliorate at least some aspects of this problem.

SUMMARY

Accordingly, in a first aspect of the invention there is provided an ink formulation comprising fine particles selected from nickel fine particles, silicon fine particles, fine particles of the formula $Ni_xSi_y$, wherein x and y are each independently in the range of 0.1 to 1, nickel and silicon composite fine particles, composite particles comprising one or more fine particles of the formula $Ni_xSi_y$, wherein x and y are each independently in the range of 0.1 to 1, and combinations thereof. Typically, x and y are each independently 1 or 2. It has been found that the deposition of particles to form a nickel silicide layer on the silicon, has unexpected results. This may be through the deposition of nickel fine particles which react with sacrificial silicon in the silicon layer, through the deposition of silicon and nickel fine particles, or nickel-silicon alloys in one of a range of forms to facilitate the formation of a nickel silicide layer or by other means. For instance, by providing a layer which does not necessarily consume the substrate (or consumes less of the substrate), not only is expensive silicon not wasted in the formation of the contacts, but also any doping present in the silicon is unaffected. It may, in some circumstances, be advantageous to allow a small amount of the silicon to be consumed, this may help to ensure that bonding between the silicon and the contact is strong, however, the amount consumed should be no more than necessary in view of the alteration to the doping levels which will result. Further, the nickel silicide layer forms a non-permeable barrier layer, onto which other substances, such as copper can be placed. This allows for the provision of a contact system which is superior to a system comprising nickel silicide alone, but which retains all of the benefits in terms of reduced cost components described above.

Further, the use of fine particulate nickel and silicon provides for good surface coverage, through an increased particulate contact area, reduced particle melting point, and the ability to produce thinner layers and hence reduce Z-axis conductivity.

In some instances, the ink may comprise fine particles of the formula $Ni_xSi_y$ where $x=y=1$. In other words, nickel silicide (NiSi) fine particles. However, other nickel and silicon containing particles may be present, whether alone or in combination with the nickel silicide. As such, the ink may alternatively or additionally comprise fine particles of the formula $Ni_xSi_y$ where $x=1$, and $y=2$; and/or fine particles of the formula $Ni_xSi_y$ where $x=2$, and $y=1$. The presence of $NiSi_2$ and/or $Ni_2Si$ provides an ink which provides a nickel silicide layer during curing, by reaction of the $NiSi_2$ and/or $Ni_2Si$ to form NiSi.

It is also possible that the ink comprise a combination of nickel fine particles and silicon fine particles which will react during curing to form nickel silicide. In such cases, the ratio of nickel to silicon is generally in the range 0.8:1-1.2:1, often around 1:1 or with a slight excess of nickel to ensure that the nickel reacts with the anti-reflective coating in the formation of the nickel silicide layer. For instance, the ratio may be in the range 1:1-1.1:1 or 1.2:1. Indeed, it will often be the case that regardless of the form in which the nickel and silicon are applied to the silicon surface that the nickel to silicon ratio will be controlled such that the above ratios apply or that there is a slight excess of nickel.

As used herein, reference to fine particles of a specified type is intended to be a reference to fine particles containing the identified component. For instance, reference to a nickel fine particle is reference to a fine particle comprising nickel. Generally, the identified substances (such as nickel) will be the primary constituent of the fine particle, such that the fine particle could be said to consist of the identified substance, or at least consist essentially of the identified substance. It is therefore envisaged that a fine particle will comprise in the range 80-100 wt % of the identified component (for instance 80-100 wt % nickel, or a combined total of 80-100 wt % nickel and silicon), or 85-99.9 wt %, or 90-99.5 wt % of the fine particle.

Further, where a fine particle is referred to as a nickel or a silicon fine particle it will generally be the case that the fine particle will not include, or will include only trace amounts of the other of nickel or silicon, perhaps in the range 0-0.5 wt %, or 0.01-0.1 wt %. The fine particle may also be a nickel and silicon composite particle, in such cases curing the ink formulation will cause the nickel and silicon to react to form nickel silicide. Fine particles of $Ni_2Si$, $NiSi_2$ or combinations thereof may also be used, and where these fine particles form part of the ink formulation, curing the ink formulation will cause the formation of the nickel silicide contact. Composite particles of $Ni_2Si$ and $NiSi_2$ optionally together with nickel, silicon, or nickel silicide may also be used.

As used herein the term "fine particle" is intended to mean a particle of mean particle size (particle size diameter along longest axis) in the range 1 to 200 nm, often 5-100 nm, or 10-50 nm, or even 10-20 nm. They will therefore often be nanoparticles, although microparticles of particle size range 0.1-100 μm, often 1-50 μm may also be used.

The ink may further comprise fine particles of a conducting metal such as silver. Such fine particles may be present in 0-1 wt % to the total $Ni_xSi_y$ content of the ink.

The ink may further comprise a dopant, such as phosphorous, arsenic, boron or combinations of these. Dopants are commonly used in semi-conductor systems, and the doping levels would be well known to the skilled reader. The dopant may be present in the fine particles in the ink formulation, or may form a separate component of the ink. Typically, the printed $Ni_xSi_y$ layer is doped with the same concentration or slightly higher of dopant such as phosphorous for example $P_2O_5$, red phosphorous, trimethylphosphine, phosphoric acid, tributylphosphate, tributylphosphine oxide, trioctylphopshine, trioctylphosphine oxide, triphenyl phosphate, triphenylphosphine, tris(2-ethylhexyl) phosphate or $POCl_3$.

The fine particles may be coated, optionally with dopant, or with other components which can act to stabilise the composition. The presence of a coating can improve the shelf life of ink containing the fine particles, as the fine particle dispersion, generally a colloid, is stabilised. Alternatively, where a paste, for instance for use in screen printing, is being prepared, this too can be stabilised by the presence of the coating. The coating may be an organic coating formed from a heterocyclic compound, often a saturated furan such as a tetrahydrofuran, coatings formed from tetrahydrofuran derivatives are often used, for instance, the coating may be tetrahydrofurfuryl alcohol (THFA). It is thought that when THFA is applied to the fine particles as a coating that the level of surface oxidation of the particles is reduced. Other coatings include diethylene glycol butyl ether (DEGBE) and PVP. In the case of DEGBE and THFA these also form part of the ink solvent system.

As used herein the term "coating is intended to refer to complete or partial covering of a particle core. The coating may be adhered to the core through physical interaction (for instance Van der Waals forces) or through chemical bonding (direct or indirect) to the core material. Whilst the coating may be partial, the coating is most effective where it substantially covers the core. In preferred examples the surface of the core is covered by the coating.

A typical ink formulation would include one or more of solvent, lubricants, solubilisers, viscosity enhancers, initiators, and antimicrobials. The ink of the invention would generally include. In some cases a dopant will also be present. Many of these components will be conventional and well known to the skilled reader; however, solvents which may often be used include THFA and diethylene glycol butyl ether (DEGBE), as these solvents have been found to offer enhanced dispersion of the fine particles. In many cases DEGBE will be used as the use of this solvent provides for a stable dispersion of nanoparticles, removing the need to stabilise the nanoparticles by coating as described above.

In a second aspect of the invention there is provided a combination of ink formulations, the combination comprising a first formulation comprising nickel fine particles and a second formulation comprising silicon fine particles. The combination may be applied sequentially or simultaneously to the silicon substrate. By sequential application it is intended to mean that one of the first or second formulation is applied to the substrate, followed by the other of the first or second formulation, prior to curing. Application may be using any of the techniques described below.

In a third aspect of the invention there is provided a solar cell comprising nickel silicide in contact with a silicon layer. Often the silicon layer will be the top silicon layer, by which we mean the layer above the junction, in many cell designs this is a thin layer, the layer below the junction (the bottom layer) being significantly thicker. The top layer allows almost all incident light pass through to the bottom where electrons are generated.

Often the solar cell will comprise nickel silicide tracks in contact with the silicon layer, as used herein the term "tracks" is intended to relate to any area of a passivation layer or anti-reflective coating which is cleared to allow the deposition of the ink and formation of the nickel silicide contacts. The term tracks is not intended to denote any specific shape of configuration, merely a recessed area formed by removal of the passivation layer and/or anti-reflective coating. The tracks may be elongate structures, but they may also adopt a wide variety of other configurations as necessary for the design of the solar cell.

Often tracks will be used, although in some cases the nickel silicide contact layer instead will be formed over the passivation layer or anti-reflective coating and the contact formed through diffusion of the nickel through the intervening layer to the silicon surface. In such cases a diffusion enhancer may be present in the ink formulation, the diffusion enhancer will often be a metal oxide, and when applied as part of the ink formulation to the passivation layer or anti-reflective coating oxidises the coating, etching the surface and allowing diffusion of the nickel and silicon containing particles through the passivation layer or anti-reflective coating to the silicon surface. The diffusion enhancer acts as a conduit to facilitate movement of the nickel and silicon containing particles through the passivation or anti-reflective coating layer. Where the anti-reflective coating comprises silicon nitride, reduction of the metal oxide could be said to follow the following reaction:

$$MO_x + Si_3N_4 \rightarrow SiO_2 + M + N_2$$

And so the reduction of the metal oxide effectively provides for an etching of the anti-reflective coating, allowing the nickel and silicon containing particles to contact the silicon surface below.

Typically the diffusion enhancer will be a nano-metal oxide to facilitate ink formulation and colloidal stability. Often, the metal oxide will be selected from nickel, zinc, lead, bismuth, cerium, gallium, tin, indium, vanadium, tellurium, barium containing metal oxides and combinations thereof.

A copper coating may be present in the solar cell, generally this will be deposited over the nickel silicide layer. The presence of a copper coating can improve the conductivity of the contact. Often the copper coating will cover just the nickel silicide, and hence the nickel silicide tracks, this is because wider coverage will retard cell efficiency by preventing the silicon covered from harvesting light energy. Silver coatings may also be used. In addition, nickel could also be deposited, through electroless or other deposition means, on the nickel silicide layer or as part of the formation of the nickel silicide layer.

In a further aspect of the invention there is provided a process for the formation of fine particles, the process comprising: introducing NixSiy wherein x and y are independently 1 or 2, Ni and/or Si into a plasma stream, thereby vaporising some or all of the NixSiy, Ni and/or Si; and cooling thereby creating fine particles comprising NixSiy, nickel and silicon composite fine particles, composite particles comprising one or more fine particles of the formula NixSiy, and combinations thereof; and stabilising the fine particles downstream of a region where the fine particles are formed using a method selected from coating the fine particles and/or dispersing the fine particles in solvent. Often the coating of the fine particles is prior to exposure of the fine particles to air, as this ensures that no oxidation of the surface of the fine particles has occurred. The coating process may be as described in co-pending application WO 2010/073021, or alternative methods may be used. In particular, the coating may be vaporized, and the fine particles passed through the vapour downstream of the plasma stream. Often the coating material will be an organic coating, often THFA or diethylene glycol butyl ether (DEGBE). It has been found that fine particles coated with THFA or DEGBE in this way form stable dispersions and are easily filtered. The filtered fine particles can be directly incorporated into pastes or inks without further washing steps.

Alternatively, the fine particles may be dispersed in a solvent, often THFA or DEGBE. The use of these solvents, in particular the use of DEGBE, removes the need to coat the particles in order to stabilise the formulation, and prevent aggregation. Thus, a stable dispersion, which is easy to filter can be provided without loss of nanoparticle surface activity through coating, and without the need to include the additional coating step.

In a further aspect of the invention there is provided a method of applying nickel silicide to a solar cell comprising the steps of:
a. forming fine particles selected from nickel fine particles, silicon fine particles, nickel and silicon composite fine particles, fine particles of the formula $Ni_xSi_y$, and combinations thereof; wherein x and y are each independently in the range of 0.1 to 1;
b. applying the fine particles to a surface of the solar cell; and
c. curing the fine particles.

Typically, x and y are each independently are 1 or 2. Often the particles are formed using plasma processing, milling or combinations thereof, although other methods of preparing fine particles may also be used, these methods are preferred because the particle size and composition of the fine particles are easily controlled. Further, with plasma processing methods in particular, the composition of the particles can be controlled with precision, coating is easy and a narrow particle size distribution can be achieved. Where used, the plasma system will generally be conventional, for instance it may be selected from a DC plasma system, RF plasma system and a microwave plasma system. Often, the system will be a microwave plasma system because such systems generally produce high purity fine particles which are well characterised in terms of shape and size. Alternatively, milling may be used.

Where dopant is present, and this is to be an integral component of the fine particles, it may be co-milled with the nickel and/or silicon containing components or co-fed into a plasma system so that the fine particles will be doped as they are produced. By controlling the ratio of dopant to the other components the level of dopant present may be controlled.

Fine particles of an additional conducting metal, such as silver may be included with the $Ni_xSi_y$ particles as described above.

Generally, the method above will comprise the additional step of formulating the fine particles into one or more ink formulations as this step improves the evenness of deposition of the fine particles onto the surface of the solar cell.

It will often be the case that the fine particles, ink formulations or combinations of fine particles are applied to the silicon surface using printing techniques. Where the fine particles are not nickel silicide fine particles, these will react in situ to form a nickel silicide layer, often during curing. Often ink jet printing techniques are used, although alternative methods such as screen printing, aerosol application, gravure, may also be used. It will generally be the case that non-contact techniques will be used, as these are less likely to damage the silicon surface and hence, thinner solar cells may be made. In other words, the silicon layer need not be as strong because when non-contact methods are used it does not need to resist the pressures of direct contact application processes. This reduces costs and improves cell efficiency as the distance that the electrons/holes must travel to the electrodes is reduced and so energy collection is improved.

It has been found that the highest accuracy of deposition of the ink formulation can be obtained with ink jet printing techniques. Such techniques can produce far smaller contacts (for instance, smaller holes or finer lines) than previous techniques; this reduces the shadowing effect improving cell efficiency. Further, compared to the commonly used screen printing techniques, the use of ink jet printing techniques reduces ink costs as ink is only deposited where needed, rather than being applied across the entire surface in order to be pushed through the screen printing template. Often printing will occur at elevated temperature to control surface wetting.

As noted above, a key advantage to providing the nickel and silicon necessary to form a nickel silicide layer in the ink formulations is that the silicon substrate is not consumed in the formation of the nickel silicide layer, reducing the amount of silicon substrate required, and ensuring that doping levels are maintained within the substrate.

Often the step of applying the fine particles to a surface of the solar cell comprises exposing the silicon layer and applying the fine particles to the exposed silicon. This can be through removal of sections of the passivation layer and/or anti-reflective coating to form tracks. This provides for direct contact between the nickel silicide and the silicon within the cell.

It has been found that when the ink formulation is applied to the tracks that surface tension effects stop the ink from spreading outwards from the tracks onto the anti-reflective coating or passivation layer.

It may be that the silicon layer is exposed by laser cutting of the passivation layer and/or anti-reflective coating to provide contact tracks. The ink formulation can then be applied to the tracks. The use of a laser is advantageous as it is rapid, accurate, provides improved curing penetration and allows the tracks to be formed in a variety of configurations.

Alternatively, the step of applying the fine particles to a surface of the solar cell may comprise application of the fine particles to an anti-reflective coating or passivation layer covering a silicon layer and facilitating diffusion of the fine particles through the anti-reflective coating or passivation layer to contact the silicon. The diffusion may be facilitated using thermal methods and/or diffusion enhancers as described above.

Where diffusion enhancers are used, these are generally in combination with thermal methods. Such methods include convection methods, such as the use of a convection oven. Often this will be in an inert atmosphere, for instance a nitrogen or argon atmosphere, so ensure that the diffusion reaction is controlled, through the minimisation of air oxidation reactions.

The curing of the fine particles will often be curing with a laser, annealing and/or curing through convection heat. Curing with lasers is particularly advantageous due to the accuracy of curing, and because they can be used efficiently with ink jet printing procedures. Where the application of the fine particles to the silicon surface includes the step of laser cutting tracks in the passivation layer and/or antireflective coating, the same laser may be used for both processes, further increasing process efficiency. For instance, the laser could precede an ink jet head to form a track, application of the fine particles following directly after track formation. The laser could then sweep back across the track to cure the fine particles and form the nickel silicide contact, or a second laser may be used. Therefore, in some cases the step of curing the fine particles will occur very quickly after the particles are applied to the surface of the solar cell, for instance, at a time in the range 0.05-1 seconds, even 0.1-0.5 seconds after the step of applying the fine particles. Often the laser will be a high frequency laser, often a laser with pulsewidths in the nanosecond or femtosecond range.

This embodiment of the process of the invention, using a single laser to cut a track and an ink jet printing technique to apply the fine particles, offers a particularly quick and simple contact formation method which can be seen as a "one step" process where the apparatus contains one or two lasers to expose the silicon layer and cure the fine particles and a non-contact print head to deposit the fine particles. If a single laser can be used for both the exposure and curing steps, this will generally be the configuration used; however, it may be the case that different laser qualities are needed for each step and in these cases two lasers may be used.

As an aim of the invention is to provide contacts which are smaller than those available in the prior art, the tracks or area of application over the anti-reflective coating or passivation layer will be as small as possible.

After curing there may be the additional step of applying copper to the solar cell. Often the copper will be applied in a layer over the nickel silicide and/or anti-reflective coating. Often the copper will cover the nickel silicide only, so that the contact area and shadowing of the cell is minimised. Alternatively, the copper may be applied after application of the fine particles and before curing. The copper may be applied using one or more of a range of well known techniques including, electroplating, LIP, printing, electroless plating and combinations thereof. It has surprisingly been found that the use of fine particles of nickel-silicon compounds (of the formula $Ni_xSi_y$ as defined herein) provides for electroless plating of copper without the need for a separate activator or catalyst. Where the copper is printed onto the ink formulation, it may be advantageous to cure both the fine particle and copper simultaneously, to reduce the number of steps needed in the process. It has been found, that even where the copper is applied to the ink formulation prior to curing, a nickel silicide layer is formed which can act as a diffusion layer preventing contact between the copper and the silicon.

In a further aspect of the invention there is provided the use of an ink or ink combination according to earlier aspects, as a barrier layer in a silicon semi-conductor device, in particular in a solar cell. Often the semi-conductor device will be a printed semi-conductor device. In a yet further aspect there is provided use of an ink or ink combination according to earlier aspects, in an electrode system. The electrodes may be the front and/or back electrodes in a solar cell.

Unless otherwise stated each of the integers described in the invention may be used in combination with any other integer as would be understood by the person skilled in the art. Further, although all aspects of the invention preferably "comprise" the features described in relation to that aspect, it is specifically envisaged that they may "consist" or "consist essentially" of those features outlined in the claims. In addition, all terms, unless specifically defined herein, are intended to be given their commonly understood meaning in the art.

Further, in the discussion of the invention, unless stated to the contrary, the disclosure of alternative values for the upper or lower limit of the permitted range of a parameter, is to be construed as an implied statement that each intermediate value of said parameter, lying between the smaller and greater of the alternatives, is itself also disclosed as a possible value for the parameter.

In addition, unless otherwise stated, all numerical values appearing in this application are to be understood as being modified by the term "about".

BRIEF DESCRIPTION OF THE DRAWINGS

In order that the present invention may be more readily understood, it will be described further with reference to the figure and to the specific examples hereinafter.

Four inks with various formulation were prepared using the plasma process synthesized $Ni_xSi_y$ nanoparticles.

Figure 5:
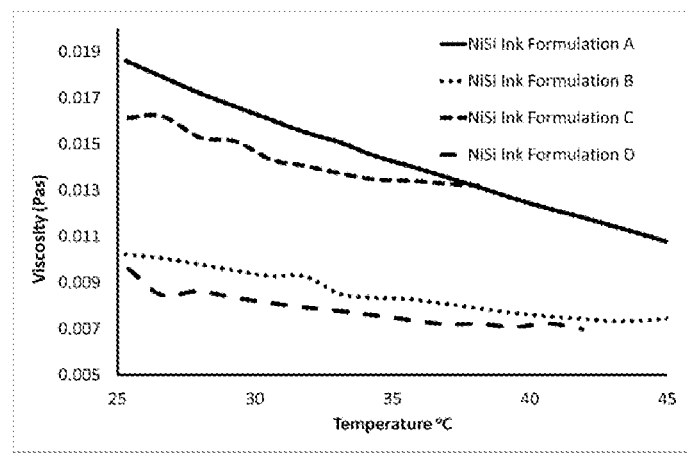

FIG. 5 shows the corresponding viscosity measurements collected for the ink formulations. The viscosity varied by changing the formation parameters, i.e., metal loading, solvents and organic coating used.

Figure 6:
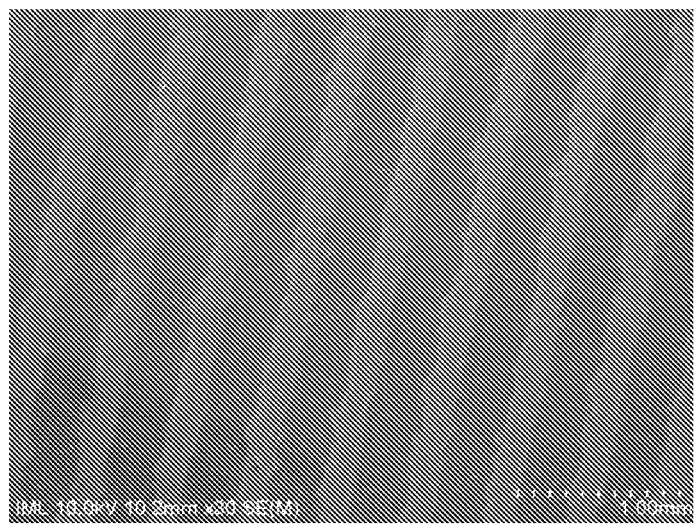

FIG. 6 shows a typical ink jet printing of the $Ni_xSi_y$ Ink Formulation A. The ink jet printed track was about 230 μm (width) on silicon wafer.

Figure 7:
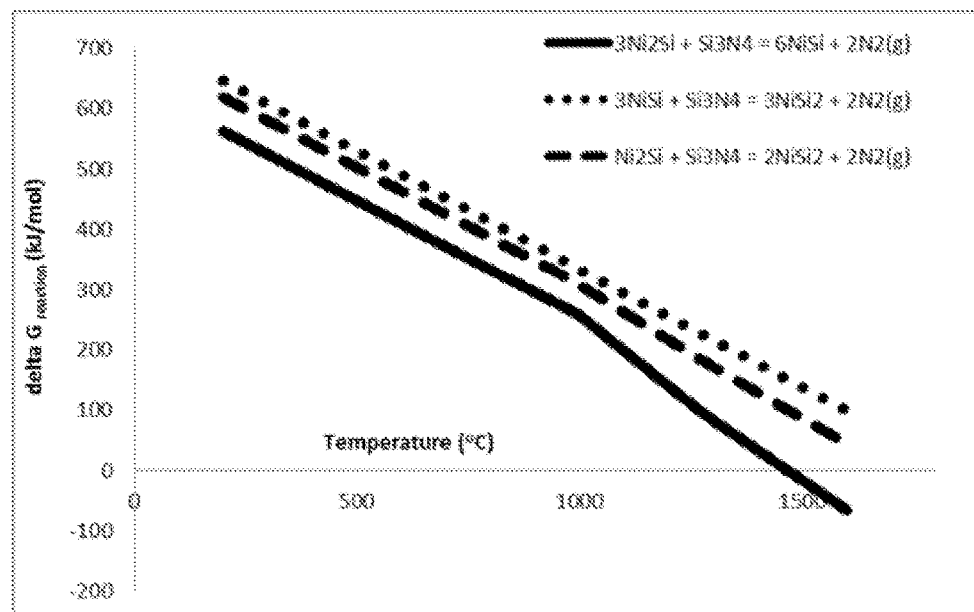

FIG. 7 shows the tendency for the reaction: $MO_x + Si_3N_4 \rightarrow SiO_2 + M + N_2$ to occur across a given temperature range in the absence of a diffusion enhancer.

Figure 8:
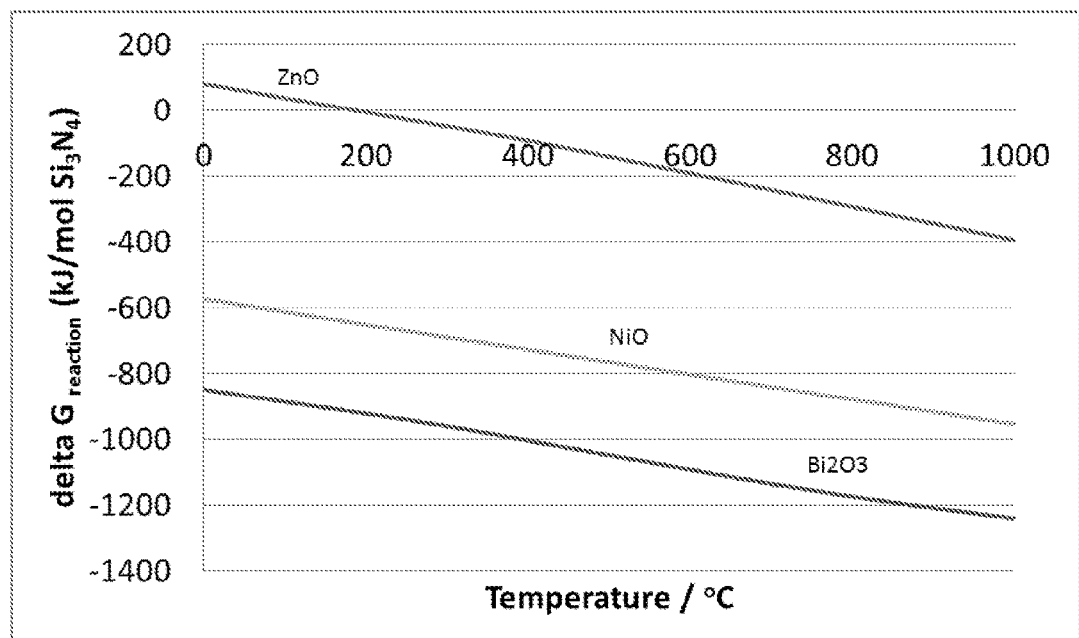

FIG. 8 shows the tendency for the reaction $MO + Si_3N_4 \rightarrow SiO_2 + M + N_2$ to occur across a given temperature range in the presence of a diffusion enhancer.

DETAILED DESCRIPTION

Figure 1:
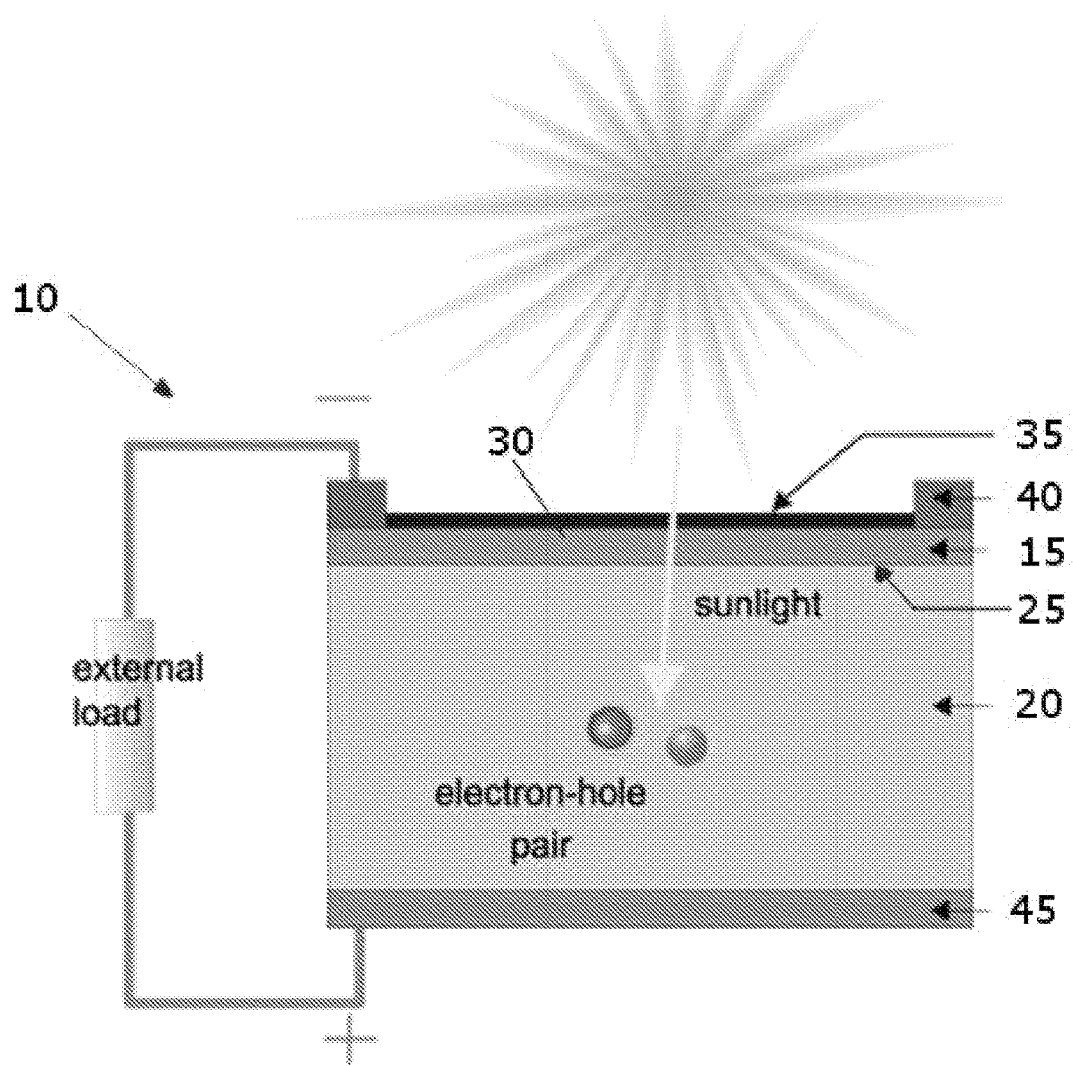
FIG. 1 is a schematic diagram of a solar cell of the invention.

A typical structure of a solar cell 10, as shown in FIG. 1, comprises a silicon emitter 15 and base 20 separated by a junction 25. A top surface of the solar cell 10 (the top surface 30 of the emitter 15) is covered by an anti-reflective coating 35 and contacts 40 (the top contact) is fixed to this surface 30. A base contact 45 is also present. The top 40 and base 45 contacts lead to an external circuit (external load).

The solar cell 10 of the invention includes nickel silicide top and bottom contact 40, 45. These nickel silicide contacts 40, 45 were formed using laser process to expose the top surface 30 of the emitter 15. Here, 532 nm and 1064 nm laser sources can be employed for the process. Also, the laser process can be conducted under inert gas atmosphere to avoid air oxidation of the substrate. Ink jet printing of an ink formulation containing nickel and silicon composite particles of size (diameter) typically ranged from 5 nm to 100 nm onto the surface, and curing directly after printing using the laser. The contact formation process as described takes less than 1 second and the plasma techniques are as known in the art.

Alternatively, the nickel silicide contacts 40 can be formed using the laser to expose the top surface 30 of the emitter 15, aerosol application of the ink formulation, and annealing. In this alternative example the ink formulation contains $Ni_xSi_y$ fine particles with size in the range (diameter) typically ranged from 5 nm to 100 nm, which can have been generated using conventional milling techniques.

In a further method, the nickel silicide contacts 40 can be formed by oxidation of the anti-reflective coating 35 by nano-bismuth oxide particles present in the ink formulation.

EXAMPLES

Example 1—Fine Particle Structure

Figure 2A:
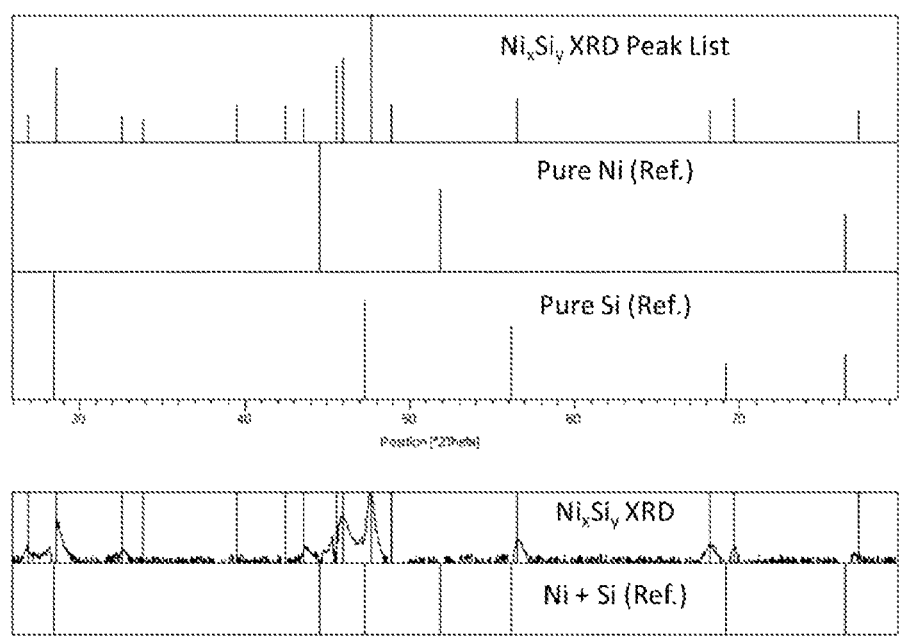
FIG. 2a shows an X-ray diffraction of a plasma synthesised $Ni_xSi_y$ nanoparticle. For comparison.
Figure 2B:
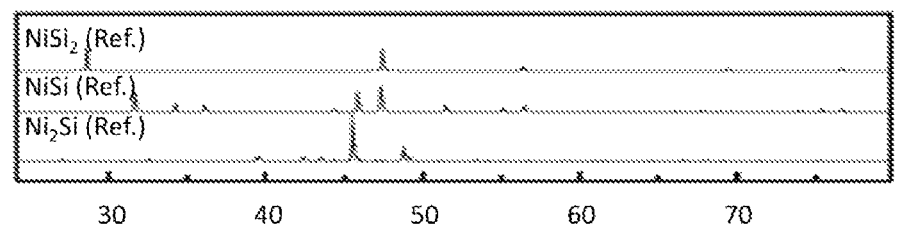
FIG. 2b shows an X-ray diffraction of a reference spectrum.

FIG. 2a shows a typical X-ray diffraction of the plasma synthesized $Ni_xSi_y$ nanoparticle. By comparing this with the diffraction patterns of pure Ni and pure Si, there was no clear sign of residual/unreacted nickel and silicon present in the $Ni_xSi_y$ nanoparticle. Therefore, it was confirmed the formation of $Ni_xSi_y$ metal alloy using the plasma process. When comparing the obtained XRD spectrum (FIG. 2a) with the reference spectra (FIG. 2b), the observed diffraction band line broadening confirmed the nano-structured $Ni_xSi_y$ sample as obtained from the plasma synthesis process.

Figure 3:
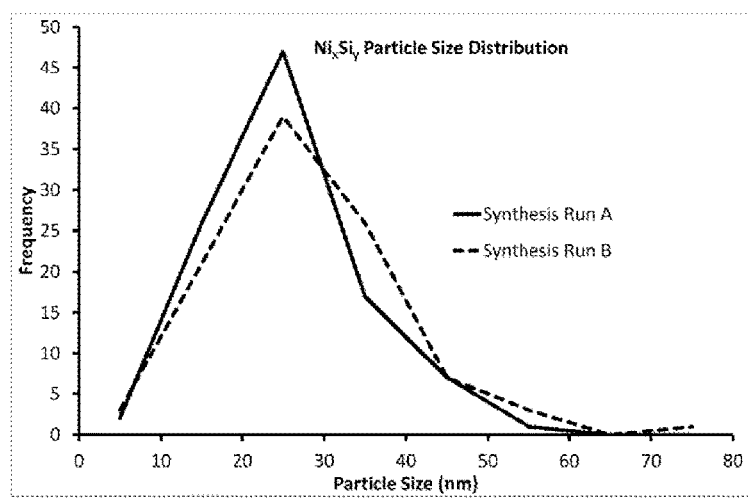
FIG. 3 shows particle size distribution analysis of the $Ni_xSi_y$ nanoparticles.

FIG. 3 shows a particle size distribution analysis of the plasma process synthesized $Ni_xSi_y$ nanoparticle. Two separate samples from two separate runs were analysed. These comparable results shows that the synthesis was repeatable. The particle size of $Ni_xSi_y$ ranged from 5 nm to 100 nm.

Figure 4:
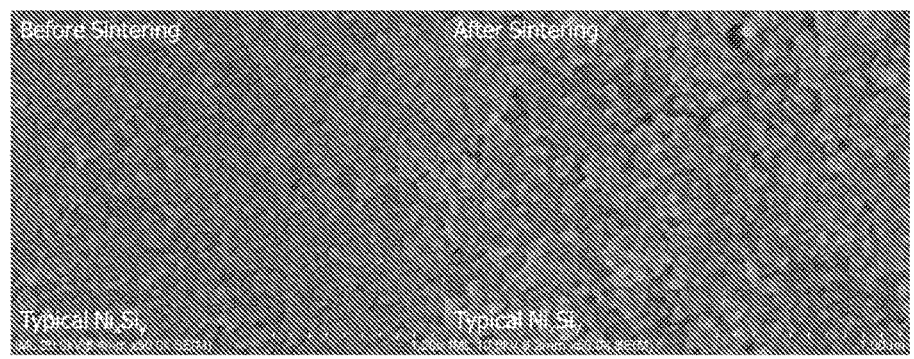
FIG. 4 shows scanning electromicroscopy of $Ni_xSi_y$ nanoparticles before and after sintering.

FIG. 4 shows a SEM analysis over the typical NixSiy nanoparticles before and after sintering. The sintering process was used to form a conductive film of $Ni_xSi_y$ from its nanoparticle. Here, the SEM analysis demonstrated a sintered $Ni_xSi_y$ structure/film.

Example 2—Ink Formulation

The ink was prepared as a colloidal dispersion of NixSiy nanoparticles employing several coatings adsorpted on the surface of the metal nanoparticle as a dispersant. The desired coating system may be accompanied by a suitable solvent system in order to form the stable colloidal stable ink formation. The solvents and stabilizer suitable to be used for the ink preparation includes: acetone, ethanol, isopropanol, diethylene glycol butyl ether (DEGBE), ethyl acetate, pentyl acetate, ethylene glycol, n-butanol, 1-methoxy-2-propanol, tetrahydrofuran, tetrahydrofurfuryl alcohol, isopropyl alcohol, octadecene, 2-m ethyltetrahydrofuran, N,N-diethylhydroxylamine, 2-butoxyethyl acetate, dodecane, toluene, water, 1,2-propyl glycol, polyvinyl pyrrolidone and benzyl alcohol.

Four inks with various formulation were prepared using the plasma process synthesized $Ni_xSi_y$ nanoparticles. FIG. 5 shows the corresponding viscosity measurements collected for the ink formulations. The viscosity varied by changing the formation parameters, i.e., metal loading, solvents and organic coating used.

FIG. 6 shows a typical ink jet printing of the NiSi Ink Formulation A. The ink jet printed track was about 230 μm (width) on silicon wafer.

Example 3—Ink Application

One method of forming the contacts between the fine particles of nickel and silicon, for instance nickel silicide particles, and the silicon surface is through oxidation of the anti-reflective coating on a solar cell with a metal oxide diffusion enhancer. The oxidation then allows the nickel silicide particles to pass through the anti-reflective coating and form a contact with the silicon surface.

The Gibbs free energy of the reaction between $Si_3N_4$ (a major component of most anti-reflective coatings) and two different nickel and silicon containing particles ($Ni_2Si$ and NiSi) were measured, as shown in FIG. 7. As can be seen, the reactions are not thermodynamically favourable at temperatures below around 1500° C., and then only for the reaction of $Ni_2Si$ with $Si_3N_4$ to form NiSi and $N_2$.

However, the addition of a metal oxide, as exemplified by zinc oxide, nickel oxide and bismuth oxide shown in FIG. 8, dramatically increases the favourability of the reaction, allowing for the etching of the anti-reflective coating and the formation of the contact by diffusion of the nickel silicide into the etched space.

It should be appreciated that the ink formulations, methods, processes and uses of the invention are capable of being incorporated in the form of a variety of embodiments, only a few of which have been illustrated and described above.

The invention claimed is:

1. A process for the formation of fine particles, the process comprising:
   introducing $Ni_xSi_y$ where x and y are in the range of 0.1 to 1, independently, Ni, and/or Si into a plasma stream to vaporize some or all of the $Ni_xSi_y$, Ni, and/or Si;
   cooling to create fine particles selected from fine particles of the formula $Ni_xSi_y$ where x and y are in the range of 0.1 to 1, independently; nickel and silicon composite fine particles; composite particles comprising one or more fine particles of the formula $Ni_xSi_y$ where x and y are in the range of 0.1 to 1, independently; or combinations thereof; and
   stabilizing the fine particles downstream of a region where the fine particles are formed using a method selected from coating the fine particles in tetrahydrofurfuryl alcohol and/or diethylene glycol butyl ether and/or dispersing the fine particles in solvent comprising tetrahydrofurfuryl alcohol and/or diethylene glycol butyl ether.

2. The process of claim 1, wherein the fine particles of the formula $Ni_xSi_y$ comprises $Ni_xSi_y$ where x is 1 and y is 1.

3. The process of claim 1, wherein the fine particles comprise nickel fine particles and silicon fine particles.

4. The process of claim 3, wherein a ratio of nickel to silicon is in the range of 0.8:1 to 1.2:1.

5. The process of claim 1, comprising combining the stabilized fine particles with a dopant, wherein the dopant comprises phosphorous, arsenic, or boron.

6. The process of claim 1, comprising combining the stabilized fine particles with fine particles of a conducting metal.

7. The process of claim 1, comprising combining the stabilized fine particles with a diffusion enhancer, wherein the diffusion enhancer comprises a nano-metal oxide.

8. The process of claim 7, wherein the metal oxide is selected from: nickel, zinc, lead, bismuth, cerium, gallium, tin, indium, vanadium, tellurium, barium oxides, and combinations thereof.

* * * * *